March 21, 1961

J. L. JENSEN 2,976,465

SEMICONDUCTOR DEVICES

Filed Dec. 17, 1959

INVENTOR.
JAMES LEE JENSEN

BY Orrin M. Haugen
ATTORNEY

United States Patent Office 2,976,465

Patented Mar. 21, 1961

2,976,465

SEMICONDUCTOR DEVICES

James Lee Jensen, St. Louis Park, Minn., assignor to Minneapolis-Honeywell Regulator Company, Minneapolis, Minn., a corporation of Delaware Filed Dec. 17, 1959, Ser. No. 860,156

2 Claims. (Cl. 317—234)

The present invention is concerned with an improved semiconductor device such as a high power junction transistor unit which includes the advantages of good heat dissipation from the junction together with a double-ended geometry which provides highly simplified fabrication techniques. More specifically, the invention is concerned with a high power hermetically sealed double-ended semiconductor unit having electrode lead members insulatingly extended through the heat dissipating base portion of the unit in such a fashion that the leads may be turned upon themselves so as to provide double-ended construction.

Typical semiconductor units of the single-ended type which are available today, and which have lead electrodes passing through the base portion, are well known for their ease of fabrication. In this connection, the unit may be entirely assembled with the exception that the attaching of the cover member to the unit is left until last. Therefore, it is possible in these units to fabricate the semiconductor device, attach lead members thereto, completely cleanse or etch the unit, and thereafter attach a cover member to the base portion of the device. In this fashion, it is possible to completely and simply rid the unit of contaminants prior to sealing and thereby make a substantially increased production yield possible, over that which would occur if the units were not easily cleaned prior to complete encapsulation. Unfortunately however, these units provide only single-ended construction.

According to the present invention, it is possible to prepare units having the production advantages of the single-ended configuration together with the simplified installation advantages of a double-ended unit. In addition, the thermal transfer between the base mounting member and the junction portion of the unit is not significantly altered and accordingly good heat transfer is available through the base mounting member.

It is therefore an object of the present invention to provide an improved high power hermetically sealed semiconductor device having a plurality of electrodes, the device having the electrode leads insulatingly passing through the base mounting member and further having the leads turned upon themselves to provide electrical double-ended configuration.

It is a further object of the present invention to provide an improved semiconductor device configuration wherein electrode leads are insulatingly extended through the base mounting member of the device, the base mounting member being arranged to accommodate said leads in such a fashion that they may extend transversely from the base mounting member at an elevation above the lower exterior mounting surface thereof.

Other and further objects of the present invention may be readily ascertained by those skilled in the art upon a study of the following specification, appended claims, and accompanying drawing, wherein:

Figure 1:
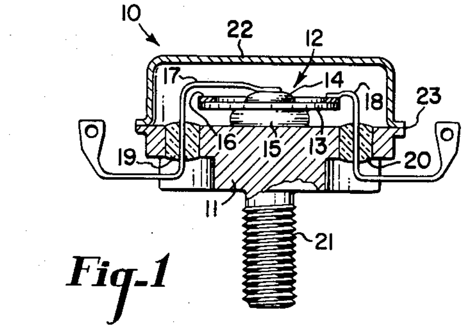
Figure 1 is a vertical sectional view taken along the lines and in the direction of the arrows 1—1 of Figure 2 of a hermetically sealed semiconductor unit fabricated in accordance with the present invention.
Figure 2:
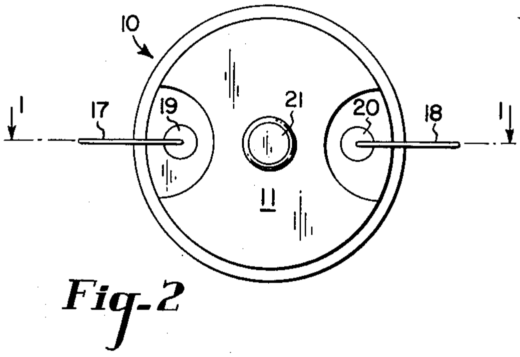
Figure 2 is a bottom plan view of the apparatus shown in Figure 1 showing the arrangement of the electrode leads extending therefrom.
Figure 4:
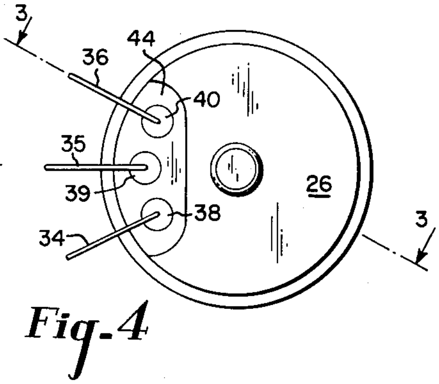
Figure 4 is a bottom plan view of the apparatus shown in Figure 3.

In accordance with the preferred modification of the present invention, as shown in Figures 1 and 2, the encapsulated semiconductor device generally designated 10, includes a base mounting member 11 upon which there is situated a junction transistor generally designated 12. The transistor device 12 includes the conventional semiconductor wafer 13 such as germanium, silicon, or the like, and has alloyed junction impurity members 14 and 15 situated on opposite sides thereof forming the emitter and collector junctions respectively. Base electrode 16 is arranged to make electrical contact with the semiconductor wafer. As is conventional and well known, in the art, these impurity members or buttons are made from a material such as gallium, indium, or aluminum when the semiconductor wafer has N-type characteristics or may be fabricated from arsenic, antimony or bismuth if the wafer has, for example, P-type characteristics. Conventional electrode leads 17 and 18 are arranged in contact with the emitter electrode and base electrode respectively. Insulated leads 19 and 20 are provided in the base mounting member 11 for insulatingly extending electrodes 17 and 18 respectively through the base mounting member which comprise, for example, copper or other good heat conducting material. The collector electrode makes electrical contact to a circuit through the base mounting member 11. A mounting stud 21 is provided for attaching the unit to the chassis or the like of the apparatus into which the completed unit is placed for operation. Cover member 22 is arranged to completely encapsulate the remaining portions of the unit and hermetically seal the device from adverse atmospheric conditions. The cover 22 is arranged in sealed contact with the base 11 along junction 23.

Figure 3:
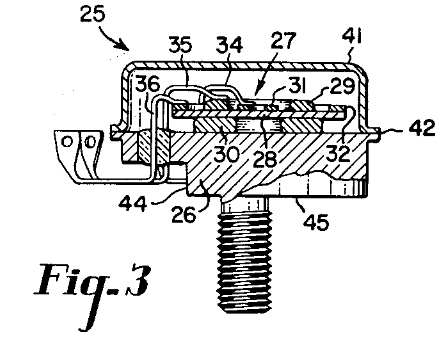
Figure 3 is a vertical sectional view taken along the lines and in the direction of the arrows 3—3 of Figure 4 showing a second modification of the present invention.

Reference is now made to Figure 3 wherein a somewhat different modification of the present invention is described in detail. In this connection, the semiconductor apparatus generally designated 25 includes a base mounting member 26 along with a tetrode semiconductor device generally designated 27. The tetrode device includes a conventional semiconductor wafer 28 along with a pair of oppositely disposed annular shaped junction members 29 and 30. In addition, a pair of spaced base electrodes 31 and 42 are arranged on opposite sides of the annular junction member 29. Electrode leads 34 and 35, and 36 are arranged in contact with the electrodes of the unit as shown. These leads are arranged to insulatingly pass through the conductive base member 26 separated therefrom by means of the insulating glass beads or the like 38, 39 and 40. Cover member 41 is arranged to be sealed along the surface 42 to form a hermetic enclosure between the mounting base 26 and the cover member 41. A portion of the lower area of the base member 26 is cut away as at 44 in order to form a cavity to accommodate the electrode leads 34, 35, and 36 transversely from the base 26 and at a point or along a plane which is elevated from the bottom or mounting surface 45 of the base member 26. This configuration, of course, provides ease of fabrication along with the advantages of a double-ended unit in circuit applications. If desired, of course, an insulating member or film may be applied over the electrode leads 34, 35, and 36 where they leave the structure.

Figure 5:
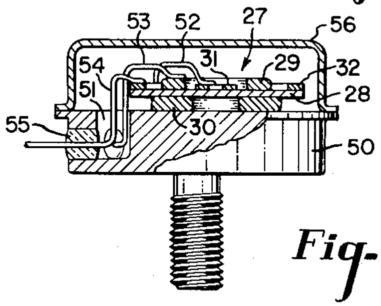
Figure 5 is a vertical sectional view taken along the line and in the direction of the arrows 5—5 of Figure 6, of still another semiconductor apparatus prepared in accordance with modification of the present invention.
Figure 6:
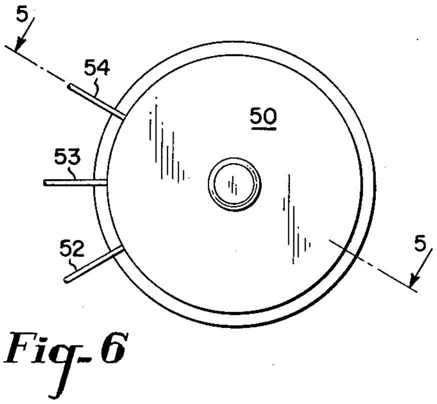
Figure 6 is a bottom plan view of the device shown in Figure 5.

Attention is now directed to Figure 5 wherein there is illustrated a tetrode transistor which is identical to that device illustrated in section in Figure 3. The device 27 is placed upon the mounting member 50 in conventional fashion. Member 50 is cored at 51 in order to provide an access area for the electrode leads 52, 53, and 54 coming from the various portions of the tetrode transistor. Leads 52, 53, and 54 are insulatingly separated from the base 50 by the insulating beads such as the insulating bead 55. As is conventional in units of this type, the cover member 56 is arranged to hermetically seal the unit from the ambient. Accordingly, the electrode leads 52, 53, and 54 may be turned upwardly after they leave the base 50, and the double-ended unit which is thereby conveniently formed.

The advantages of the various units as disclosed in the present application are readily apparent to those skilled in the art. It will be appreciated that various modifications and departures from the drawings as described hereinabove, may be made without departing from the spirit and scope of the present invention. Accordingly, it is understood that the drawings are submitted for purposes of illustration only and are not to be construed as a limitation upon the coverage to which this invention is otherwise entitled.

I claim as my invention:

1. In a semiconductor assembly including a multi-electrode semiconductor apparatus having a plurality of electrode leads extending therefrom the semiconductor body having at least one relatively large junction arranged adjacent one surface thereof, said junction being mounted in good thermally conducting relationship with a heat conducting base member, said heat conducting base member having a flat mounting surface along a certain first plane, said flat mounting surface being particularly adapted for mounting onto a chassis member, said heat conducting base member being particularly characterized in that means are provided for insulatingly extending said leads through said base member along a certain second plane which is substantially elevated from said first plane.

2. In a semiconductor assembly including a multi-electrode semiconductor apparatus having a plurality of electrode leads extending therefrom and a semiconductor body with at least one relatively large junction arranged adjacent one surface thereof, said junction being mounted in good thermally conducting relationship with a heat conducting base member, said heat conducting base member having a certain first thickness dimension and having a flat mounting surface along a certain first plane, said flat mounting surface being particularly adapted for mounting onto a chassis member, at least one peripheral portion of said base being reduced in thickness from said mounting surface so as to define a cavity therein, and means for insulatingly extending electrode leads through said base member along said peripheral portion and into said cavity.

References Cited in the file of this patent

UNITED STATES PATENTS

| | | |
|---|---|---|
| 2,574,783 | Hedding et al. | Nov. 13, 1951 |
| 2,725,505 | Webster et al. | Nov. 29, 1955 |